(12) United States Patent
Chang et al.

(10) Patent No.: US 10,854,692 B2
(45) Date of Patent: Dec. 1, 2020

(54) DISPLAY DEVICE USING SEMICONDUCTOR LIGHT EMITTING DEVICE

(71) Applicant: LG ELECTRONICS INC., Seoul (KR)

(72) Inventors: Younghak Chang, Seoul (KR); Sukkoo Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 209 days.

(21) Appl. No.: 15/963,691

(22) Filed: Apr. 26, 2018

(65) Prior Publication Data

US 2019/0206954 A1 Jul. 4, 2019

(30) Foreign Application Priority Data

Jan. 4, 2018 (KR) .................. 10-2018-0001376

(51) Int. Cl.
*H01L 27/32* (2006.01)
*H01L 33/24* (2010.01)
(Continued)

(52) U.S. Cl.
CPC ...... *H01L 27/3241* (2013.01); *H01L 25/0753* (2013.01); *H01L 27/3209* (2013.01);
(Continued)

(58) Field of Classification Search
CPC ......... H01L 33/16; H01L 33/20; H01L 33/22; H01L 33/24; H01L 33/38; H01L 33/44;
(Continued)

(56) References Cited

U.S. PATENT DOCUMENTS

2012/0056229 A1* 3/2012 Hsu .................. H01L 33/58
257/98
2012/0092867 A1* 4/2012 Kasper .............. H05K 1/02
362/235
2019/0264894 A1* 8/2019 Aketa .............. F21V 9/32

FOREIGN PATENT DOCUMENTS

KR 10-2011-0085421 A 7/2011
KR 10-2013-0142581 A 12/2013
(Continued)

*Primary Examiner* — Kent W Chang
*Assistant Examiner* — Andrew Lee
(74) *Attorney, Agent, or Firm* — Birch, Stewart, Kolasch & Birch, LLP

(57) ABSTRACT

The present invention relates to a display device, and particularly, to a display device using a semiconductor light emitting device. The display device includes a substrate including an electrode, a plurality of light emitting devices assembled on the substrate, and a color conversion part stacked on the plurality of semiconductor light emitting devices and converting a color. Specifically, the color conversion part includes: a porous layer, a wavelength conversion layer, and a reflective layer, wherein the wavelength conversion layer is disposed between the porous layer and the reflective layer, and the porous layer is formed of an electro-polishable porous terminal. A surface of the reflective layer includes a first region and a second region surrounded by the first region, the second region has roughness higher than that of the first region, and a plurality of first protrusions are disposed in the second region.

11 Claims, 18 Drawing Sheets

(51) Int. Cl.
*H01L 25/075* (2006.01)
*H01L 33/50* (2010.01)
*H01L 33/46* (2010.01)

(52) U.S. Cl.
CPC .......... *H01L 27/3211* (2013.01); *H01L 33/24* (2013.01); *H01L 33/46* (2013.01); *H01L 33/50* (2013.01)

(58) Field of Classification Search
CPC ..... H01L 33/46; H01L 33/486; H01L 33/507; H01L 33/50; H01L 33/52; H01L 33/54; H01L 33/56; H01L 33/58; H01L 33/60; H01L 33/62; H01L 33/0079; H01L 33/325; H01L 33/382; H01L 33/405; H01L 33/007; H01L 33/025; H01L 2224/16; H01L 2933/0016; H01L 2933/0025; H01L 2933/0033; H01L 2933/0066; H01L 2924/0002; H01L 25/0753; H01L 27/3241; H01L 27/3209; H01L 27/3211
See application file for complete search history.

(56) References Cited

FOREIGN PATENT DOCUMENTS

| | | |
|---|---|---|
| KR | 10-2015-0017100 A | 2/2015 |
| KR | 10-2015-0051602 A | 5/2015 |
| WO | WO 2013/125823 A1 | 8/2013 |

\* cited by examiner

DISPLAY DEVICE USING SEMICONDUCTOR LIGHT EMITTING DEVICE

CROSS-REFERENCE TO RELATED APPLICATION

Pursuant to 35 U.S.C. § 119(a), this application claims the benefit of earlier filing date and right of priority to Korean Application No. 10-2018-0001376, filed on Jan. 4, 2018, the contents of which is incorporated by reference herein in its entirety.

BACKGROUND OF THE INVENTION

1. Field of the Invention

The present disclosure relates to a display device, and particularly, to a display device using a semiconductor light emitting device.

2. Background of the Invention

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as mediocre response time, difficult implementation of flexibility in the instance of LCDs, and there exist drawbacks such as short life span, mediocre yield as well as low flexibility in the instance of AMOLEDs.

Meanwhile, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

As display devices are advancing, there may be a need to improve pixel integration or pixel density. Particularly, as pixel integration or the pixel density increases, it may be difficult to realize a color of a display device due to a size of a semiconductor light emitting device and a narrow interval between pixels. Accordingly, the present invention proposes a display device structure capable of realizing a color in a display device in which pixel integration or pixel density is high, a semiconductor light emitting device is small, a space between pixels is narrow.

SUMMARY OF THE INVENTION

Therefore, an aspect of the detailed description is to provide a display device structure for realizing a color in a display device in which pixel integration or pixel density is high, a semiconductor light emitting device is small, a space between pixels is narrow, and a manufacturing method thereof.

Another aspect of the detailed description is to improve color conversion efficiency in a display device.

To achieve these and other advantages and in accordance with the purpose of this specification, as embodied and broadly described herein, a display device includes: a substrate including an electrode; a plurality of semiconductor light emitting devices assembled on the substrate; and a color conversion part stacked on the plurality of semiconductor light emitting devices and converting a color. Specifically, the color conversion part includes: a porous layer; a wavelength conversion layer; and a reflective layer, wherein the wavelength conversion layer is disposed between the porous layer and the reflective layer, and the porous layer is formed of an electro-polishable porous terminal. A surface of the reflective layer includes a first region and a second region surrounded by the first region, the second region has roughness higher than that of the first region, and a plurality of first protrusions are disposed in the second region.

An upper surface of each of the plurality of first protrusions may be a flat cut surface.

A surface of the porous layer may include: a first region; and a second region surrounded by the first region, the second region may have roughness higher than that of the first region, and a plurality of second protrusions may be disposed in the second region.

An upper surface of each of the plurality of second protrusions may be a flat cut surface.

The reflective layer may include a plurality of layers, and at least one of the plurality of layers of the reflective layer may be a layer including III-V compounds.

An adhesive member may be provided between the porous layer of the color conversion part and one surface of the semiconductor light emitting device, so that the color conversion part and the semiconductor light emitting device can be physically coupled.

The adhesive member may be formed of a transparent material allowing light emitted from the semiconductor light emitting device to pass therethrough.

The semiconductor light emitting device may include: first and second conductivity type electrodes; a first conductivity type semiconductor layer allowing the first conductivity type electrode to be disposed thereon; a second conductivity type semiconductor layer overlapping the first conductivity type semiconductor layer and allowing the second conductivity type electrode to be disposed thereon; and an active layer disposed between the first and second conductivity type semiconductor layers, wherein the second conductivity type semiconductor layer includes: a first layer formed of an electro-polishable porous terminal and disposed on an outer side of the semiconductor light emitting device; a second layer disposed under the first layer and having an impurity concentration lower than that of the first layer; and a third layer disposed between the second layer and the active layer and having an impurity concentration higher than that of the second layer.

The display device may further include: a reflective electrode disposed between the first conductivity type electrode and the first conductivity type semiconductor layer.

A surface of the first layer may include: a first region and a second region surrounded by the first region, the second region has surface roughness higher than that of the first region, and a plurality of third protrusions may be disposed in the second region.

The plurality of third protrusions may be formed of a second conductivity type semiconductor and have an impurity concentration higher than that of the first layer.

The display device according to the present invention includes the color conversion part stacked on the semiconductor light emitting device and converting a color, and the color conversion part described above may include the porous layer formed of an electro-polishable porous terminal so as to be provided as a thin color conversion part. Accordingly, the display device, which has a high pixel concentration or a high pixel density, has a small semiconductor light emitting device, has pixels in a narrow interval therebetween, capable of realizing color may be provided.

In addition, since the color conversion part includes the reflective layer, emission of light which has not been converted in the wavelength conversion layer of the color conversion part, after being emitted from the semiconductor light emitting device, may be prevented to prevent color mixture with light converted in the wavelength conversion layer, maximizing color conversion efficiency.

In addition, in the above-described semiconductor light emitting device, since the reflective electrode is provided between the first conductivity type electrode and the first conductivity type semiconductor layer, light emitted from the semiconductor light emitting device may be utilized in the color conversion part without loss of light, and thus, color conversion efficiency may be maximized.

Further scope of applicability of the present application will become more apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
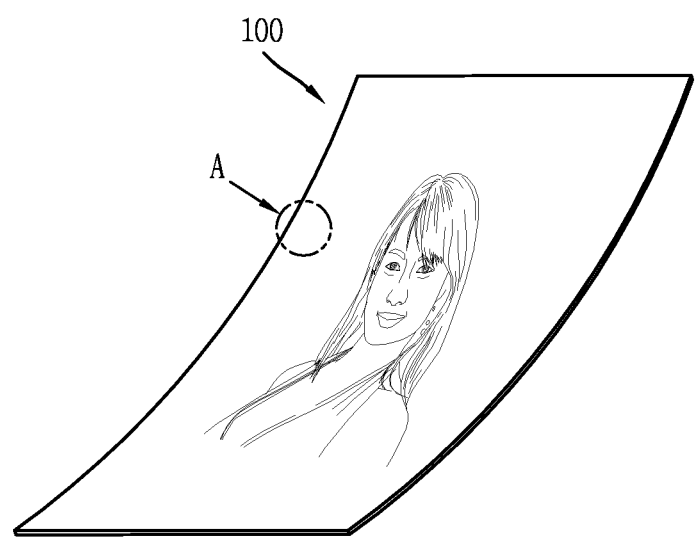
FIG. 1 is a conceptual view illustrating a display device using a semiconductor light emitting device according to an embodiment of the invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for ease of description of the specification, and the suffix itself does not give any special meaning or function. In describing the embodiments disclosed herein, moreover, the detailed description will be omitted when a specific description for publicly known technologies to which the invention pertains is judged to obscure the gist of the present invention. Also, it should be noted that the accompanying drawings are merely illustrated for ease of explaining the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
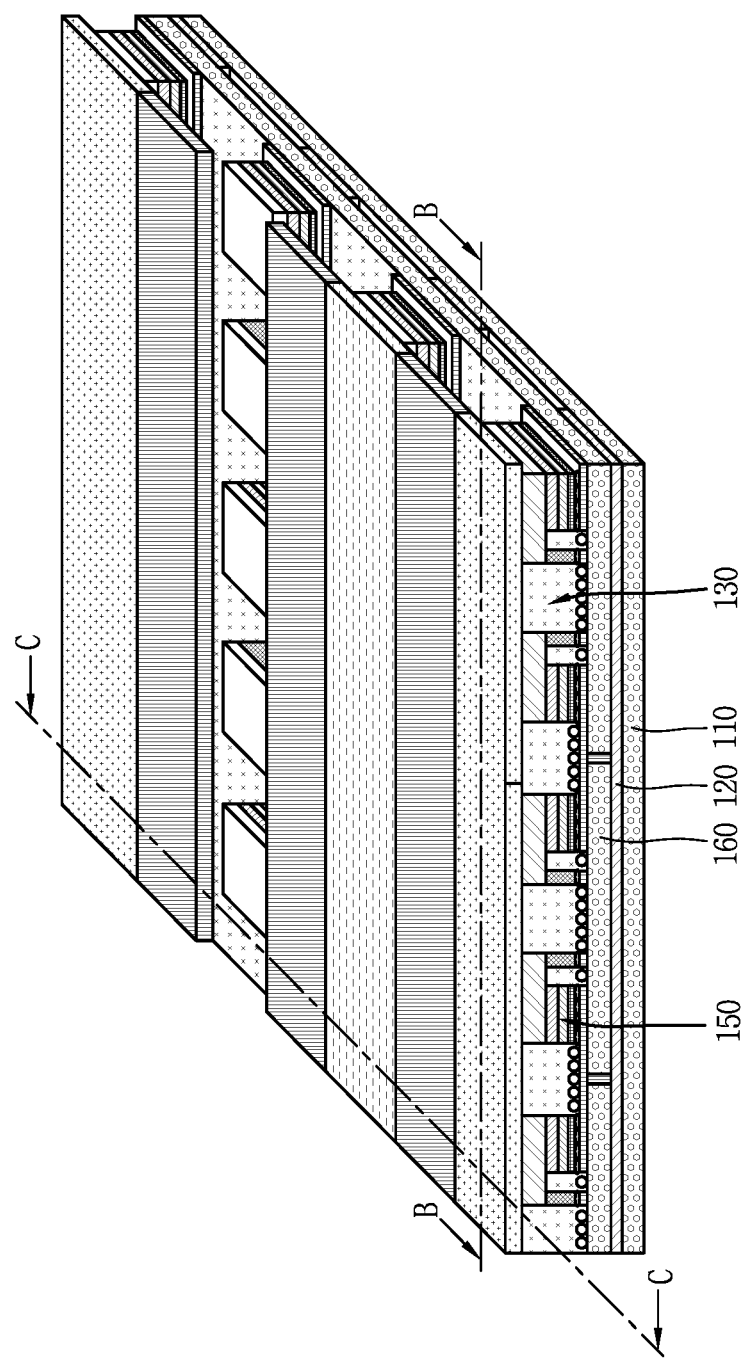
FIG. 2 is a partial enlarged view of portion "A" in FIG. 1, and FIGS. 3A and 3B are cross-sectional views taken along lines B-B and C-C in FIG. 2.
Figure 3A:
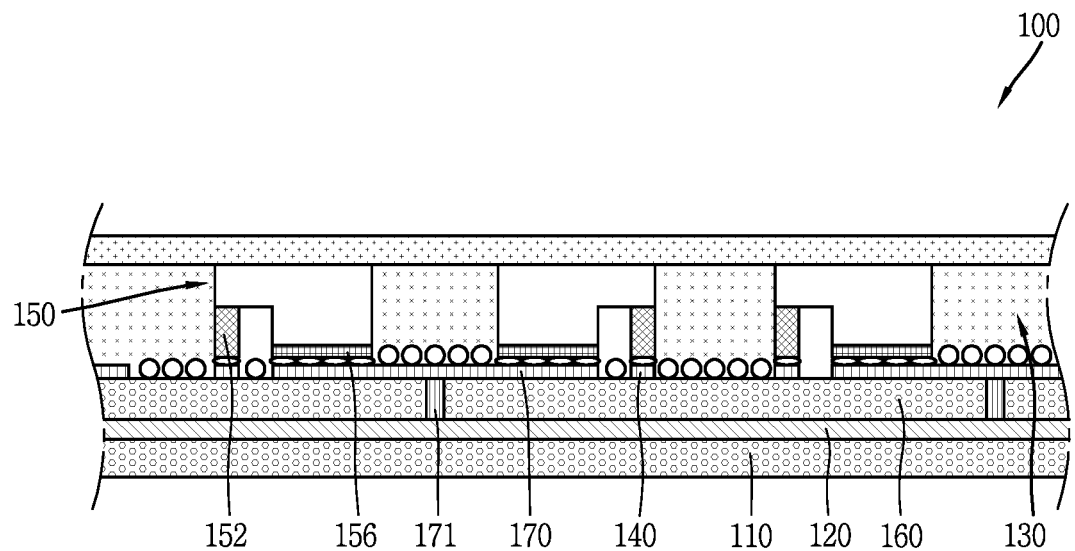
Figure 3B:
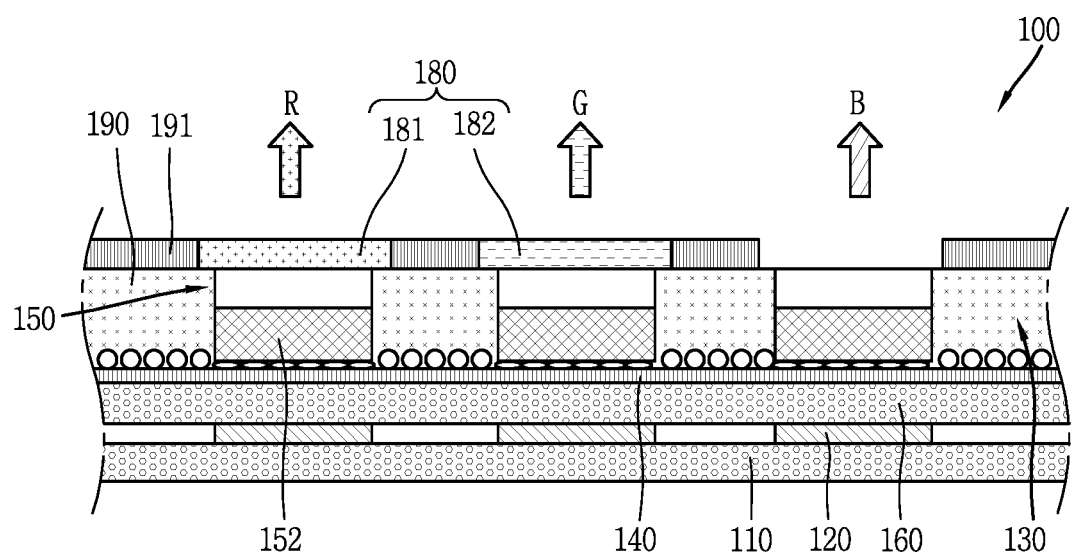
Figure 4:
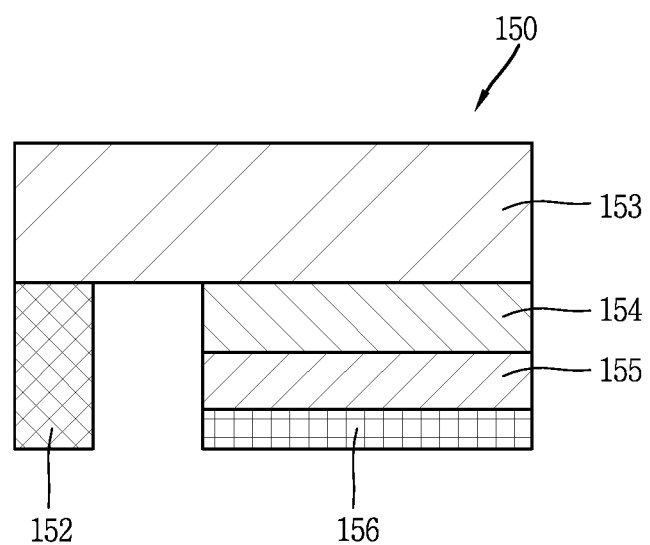
FIG. 4 is a conceptual view illustrating a flip-chip type semiconductor light emitting device in FIG. 3A.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device by way of example. However, the following illustration may be also applicable to an active matrix (AM) type semiconductor light emitting device in other embodiments.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, as a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiments of the invention may not be necessarily limited to this. For example, it may be possible to also have a structure in which a layer performing a specific function is formed between the insulating layer 160 and conductive adhesive layer 130, or the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. In this instance, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the embodiments of the invention may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices may be grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, in one embodiment of the invention, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or a green phosphor layer 182 constituting individual pixels. The phosphor layer 180 may be other color phosphor layers.

In other words, a red phosphor 181 capable of converting blue light into red (R) light may be deposited on the blue semiconductor light emitting device at a location implementing a red sub-pixel, and a green phosphor 182 capable of converting blue light into green (G) light may be deposited on the blue semiconductor light emitting device at a location implementing a green sub-pixel. Furthermore, only the blue semiconductor light emitting device may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiments of the invention may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the embodiments of the invention may not be necessarily limited to this, and another structure for implementing blue, red and green may be also applicable thereto.

Figure 5A:
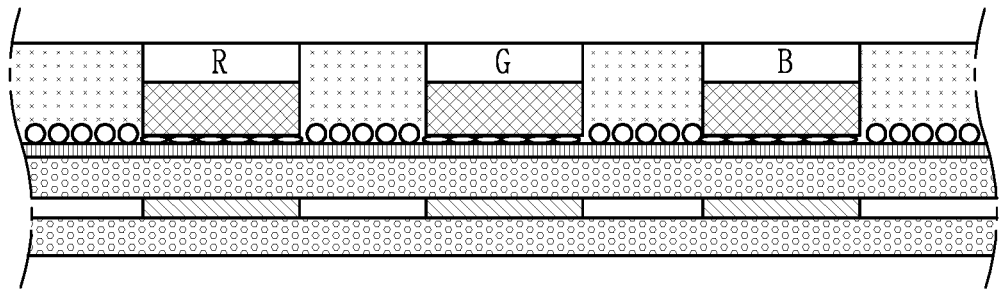
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
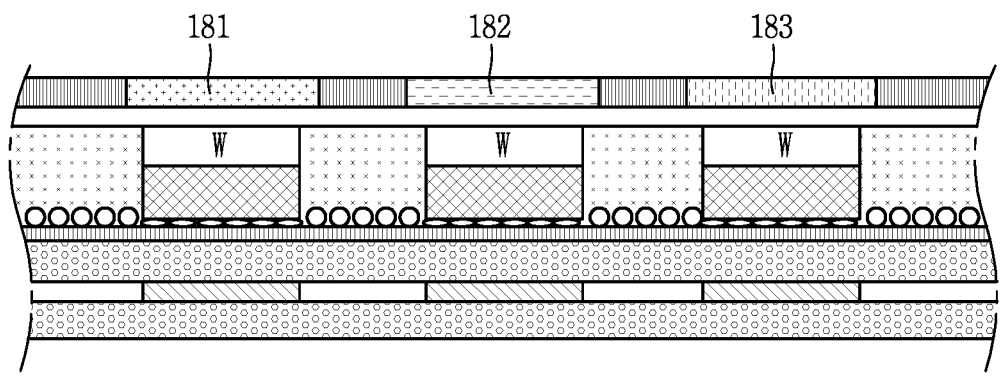

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
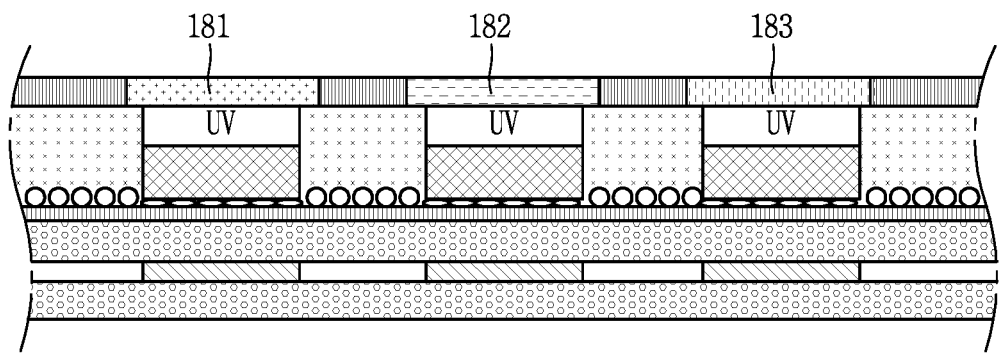

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In an instance of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, in the instance of a rectangular pixel in which one side of a sub-pixel is 600 μm in size, and the remaining one side thereof is 300 μm, a relative distance between the semiconductor light emitting devices becomes sufficiently large. Accordingly, in this instance, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
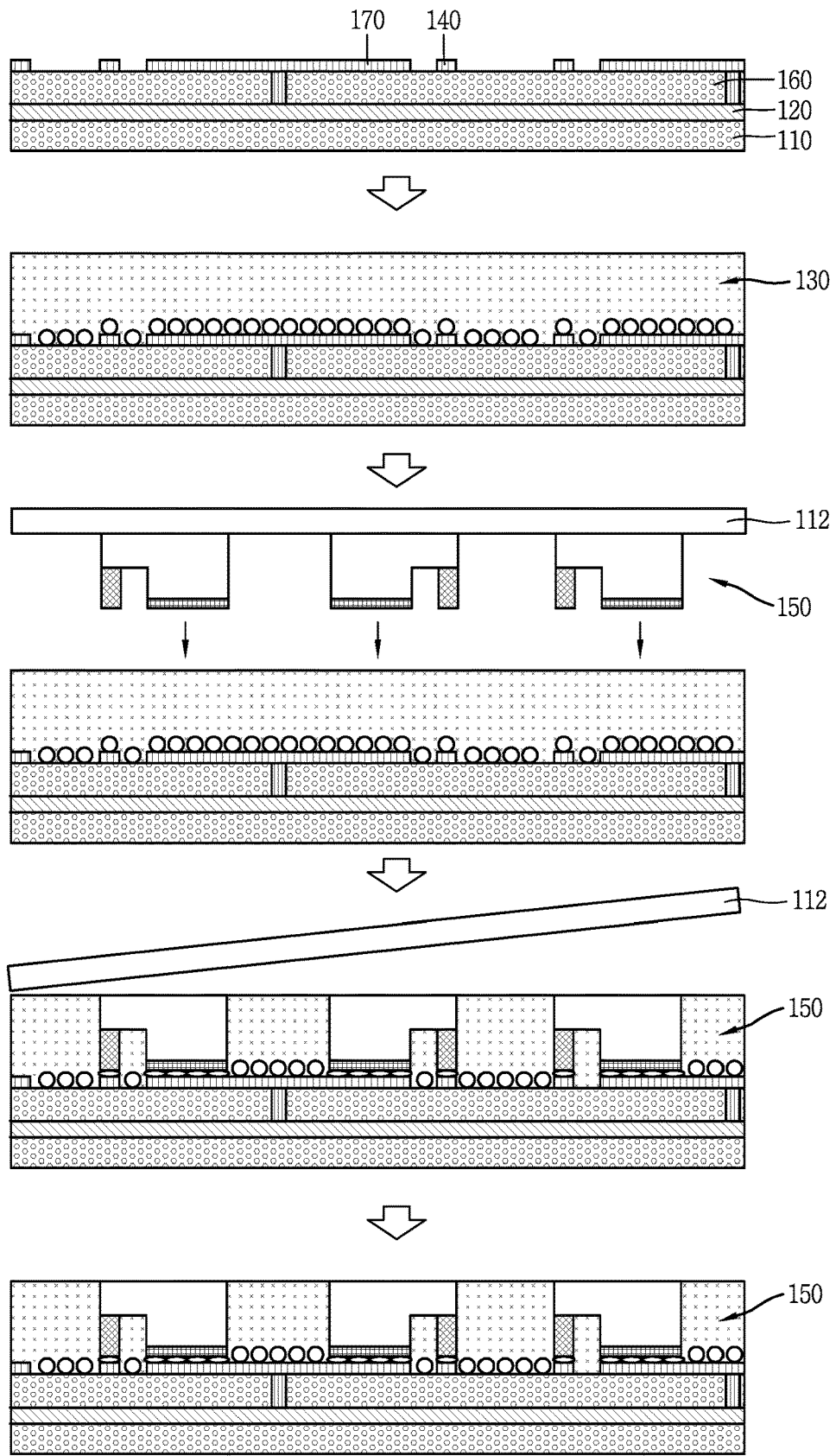
FIG. 6 is cross-sectional views illustrating a method of fabricating a display device using a semiconductor light emitting device according to the invention.

FIG. 6 is cross-sectional views illustrating a method of fabricating a display device using a semiconductor light emitting device according to the embodiment of the invention.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
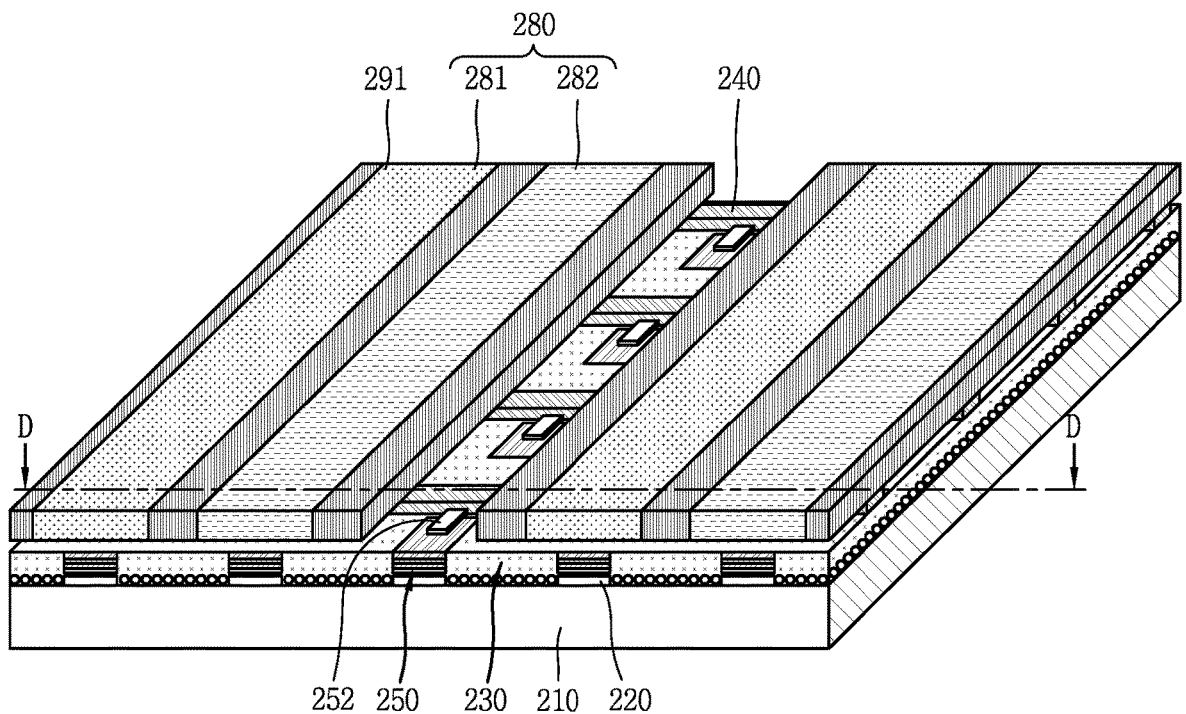
FIG. 7 is a perspective view illustrating a display device using a semiconductor light emitting device according to another embodiment of the invention.
Figure 8:
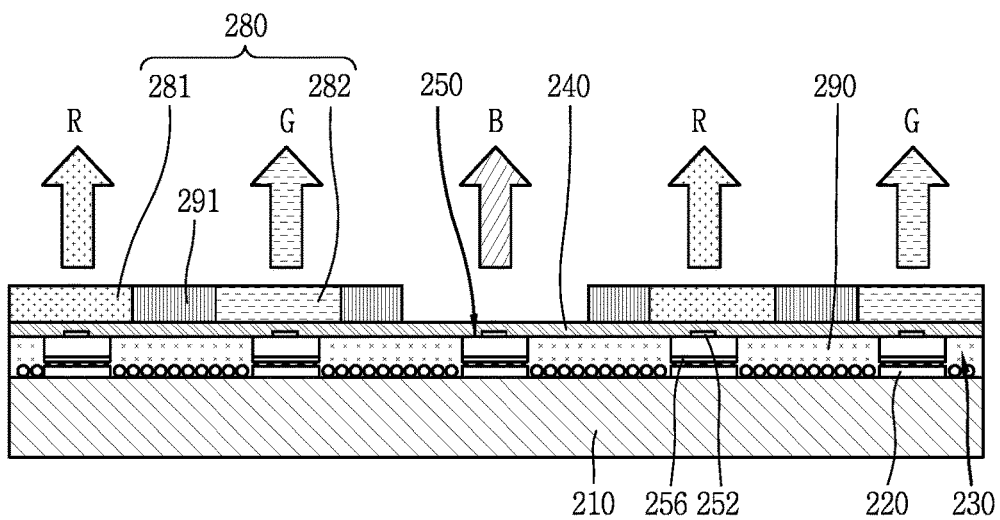
FIG. 8 is a cross-sectional view taken along line D-D in FIG. 7.
Figure 9:
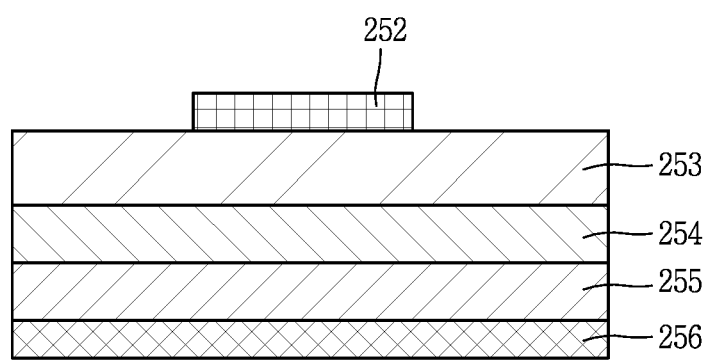
FIG. 9 is a conceptual view illustrating a vertical type semiconductor light emitting device in FIG. 8.

FIG. 7 is a perspective view illustrating a display device using a semiconductor light emitting device according to another embodiment of the invention. FIG. 8 is a cross-sectional view taken along line D-D in FIG. 7, and FIG. 9 is a conceptual view illustrating a vertical type semiconductor light emitting device in FIG. 8.

According to the drawings, the display device may be a display device using a passive matrix (PM) type of vertical semiconductor light emitting device, but in other embodiments, an active matrix (AP) type of vertical semiconductor light emitting device may be used.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates an instance where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 μm in the length of one side thereof, and formed with a rectangular or square shaped element. In the instance of a rectangular shaped element, the size thereof may be less than 20×80 μm.

The semiconductor light emitting device 250 may be of a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel.

In this instance, the red (R), green (G) and blue (B) subpixels may implement one pixel.

However, the embodiments of the invention may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels in the display device. Since the semiconductor light emitting device 250 has excellent brightness, it may form an individual unit pixel even with a small size. Therefore, a full color display in which red (R), green (G), and blue (B) unit pixels form one pixel may be realized by the semiconductor light emitting device.

As display devices using the semiconductor light emitting device of the present invention described above are advanced, there is a need to improve pixel integration or pixel density. In particular, in order to improve pixel integration or pixel density in a display device capable of realizing a virtual reality (VR) or augmented reality (AR), a display device is required to employ an ultra-small semiconductor light emitting device and to be designed to have pixels at narrow intervals. Thus, there is a limitation in applying a conventional thick phosphor to the display device having improved pixel integration or pixel density. Thus, in the present invention, a display device having a new structure capable of solving such a problem will be described.

That is, according to the present invention, it is possible to provide a display device capable of realizing a color in a display device in which a high pixel integration or pixel density is high, a semiconductor light emitting device is small, and a space between pixels is narrow, by providing a thin color conversion part.

Further, a reflective layer is provided in the color conversion part and a reflective electrode is provided between a first conductivity type electrode and a first conductivity type semiconductor layer in the semiconductor light emitting device so that a light source emitted from the semiconductor light emitting device may be utilized, without being lost, in the color conversion part. Therefore, although the color conversion part of the display device is thin, color conversion efficiency may be maximized.

Figure 10:
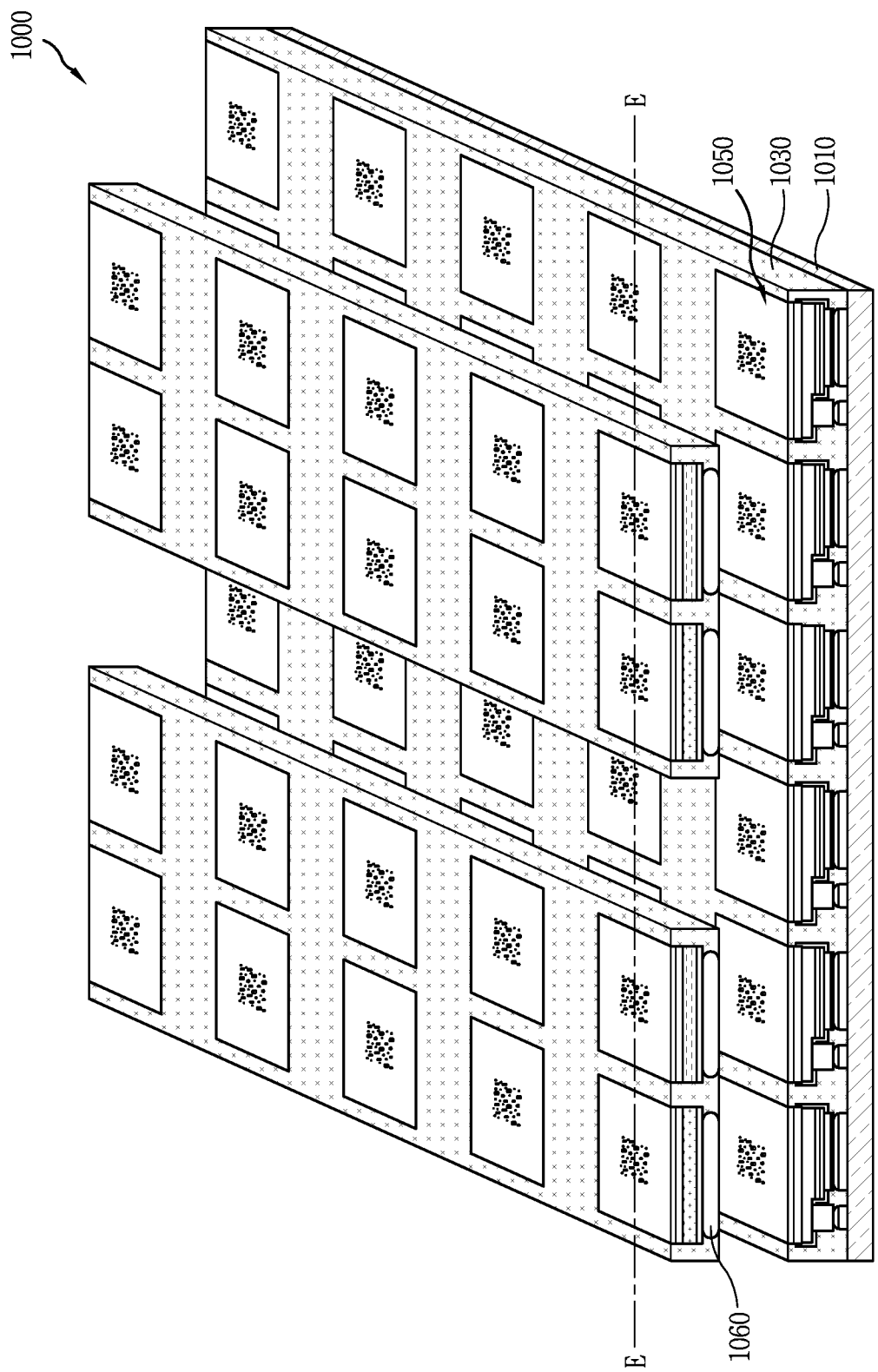
FIG. 10 is an enlarged view of portion "A" of FIG. 1 for explaining another embodiment of the present invention to which a new structure is applied.
Figure 11:
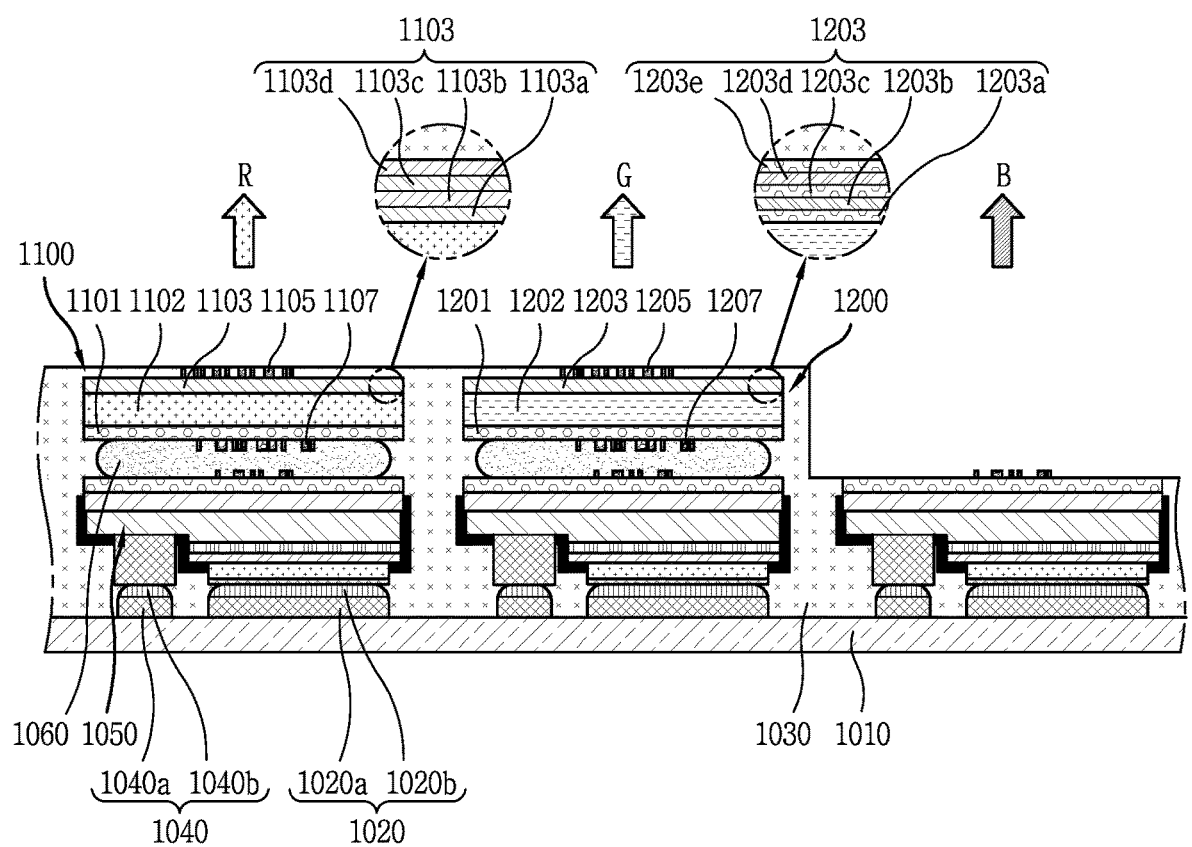
FIG. 11 is a cross-sectional view taken along the line E-E in FIG. 10.

FIG. 10 is an enlarged view of the portion A of FIG. 1 for explaining another embodiment of the present invention to which a new structure is applied. FIG. 11 is a cross-sectional view taken along line E-E in FIG. 10.

As illustrated in FIGS. 10 and 11, a display device 1000 using a semiconductor light emitting device may also be applied as a display device 1000 using a passive matrix (PM) type semiconductor light emitting device or a display device 1000 using an active matrix (AM) type semiconductor light emitting device.

The display device 1000 includes a substrate 1010, a first electrode 1020, an insulating member 1030, a second electrode 1040, and a plurality of semiconductor light emitting devices 1050. Here, the first electrode 1020 and the second electrode 1040 may protrude from the substrate 1010 and each may include a plurality of electrode lines.

The substrate 1010 is a wiring substrate on which the first electrode 1020 is disposed, and may include polyimide (PI) to implement a flexible display device. In addition, the substrate 1010 may be formed of a material which has insulating properties and which is not flexible. In addition, the substrate 1010 may be either transparent or opaque.

The first electrode 1020 protrudes from the substrate 1010 and may be formed as a bar-shaped electrode extending in one direction. The first electrode 1020 may serve as a data electrode.

Referring to these drawings, the insulating member 1030 surrounding the semiconductor light emitting devices 1050 may be disposed on one side of the substrate 1010. In an embodiment, the insulating member 1030 may include polydimethylsiloxane (PDMS) or polymethylphenylsiloxane (PMPS) as a polymer material, and surround the semiconductor light emitting device 1050, and include various materials having insulating properties.

Referring back to FIG. 10, the insulating member 1030 may be disposed between the semiconductor light emitting devices 1050 to serve as a black matrix for improving contrast of unit pixels. The black matrix may absorb external light reflected between the unit pixels and improve contrast of light and shade. Also, as shown in the figure, the insulating member 1030 may surround the semiconductor light emitting devices 1050 and color conversion parts 1100 and 1200.

The plurality of semiconductor light emitting devices 1050 may form a plurality of rows in a direction parallel to a plurality of electrode lines provided in the first electrode 1020. However, the present invention is not limited thereto.

A first conductivity type electrode 1156 and a second conductivity type electrode 1152 of each of the semiconductor light emitting devices 1050 may face the first electrode 1020 and the second electrode 1040 and may be electrically coupled thereto, respectively. Further, the aforementioned auxiliary electrode (not shown) may be provided to form electrical coupling between the first electrode 1020 and the second electrode 1040.

In detail, the first electrode 1020 may include a protruding metal layer 1020a and an adhesive layer 1020b. The first conductivity type electrode 1156 and the metal layer 1020a are electrically coupled to each other by applying pressure or heat to the adhesive layer 1020b.

Similar to the coupling between the first electrode 1020 and the first conductivity type electrode 1156, the second electrode 1040 and the second conductivity type electrode 1052 may be coupled to each other. The second electrode 1040 may include a protruding metal layer 1040a and an adhesive layer 1040b. The second conductivity type electrode 1152 and the metal layer 1040a may be electrically coupled to each other by applying pressure or heat to the adhesive layer 1040b.

The semiconductor light emitting device 1050 and the first electrode 1020 and the second electrode 1040 are electrically connected to each other by the adhesive layers 1020b and 1040b of the first electrode 1020 and the second electrode 1040, but the present invention is not limited thereto. For example, the electrodes of the semiconductor light emitting device may be electrically coupled by the above-described conductive adhesive layer, or the like. In this case, the adhesive layers 1020b and 1040b in this example may be omitted.

Further, the display device 1000 includes color conversion parts 1100 and 1200 that convert colors stacked on one surface of the plurality of semiconductor light emitting devices 1050. An adhesive member 1060 may be provided between the color conversion parts 1100 and 1200 and the semiconductor light emitting devices 1050 to form a physical connection therebetween. The adhesive member 1060 may be formed of a transparent material so that light emitted from the semiconductor light emitting device 1050 may be incident to the color conversion parts 1100 and 1200.

In an embodiment, the semiconductor light emitting device 1050 may be a blue semiconductor light emitting device that emits blue (B) light, and the color conversion parts 1100 and 1200 may serve to convert the blue (B) light incident by passing through the adhesive member 1060 into a color of a unit pixel. The color conversion parts 1100 and 1200 may be a red color conversion part 1100 or a green color conversion part 1200 that constitute individual pixels, separately.

In detail, a red color conversion part 1100 may be stacked on the blue semiconductor light emitting device 1050 at a position forming a red unit pixel to convert blue (B) light into red (R) light. In addition, at a position forming a green unit pixel, a green color conversion part 1200 may be stacked on the blue semiconductor light emitting device 1050 to convert blue (B) light into green (G) light. In addition, only the blue semiconductor light emitting device 1050 is used alone in a portion forming a blue unit pixel to emit blue (B) light. Accordingly, the red (R), green (G), and blue unit pixels may form one pixel.

More specifically, a color conversion part of one color may be stacked along each line of the first electrode 1020. Accordingly, one line in the first electrode 1020 may be an electrode for controlling one color. That is, red (R), green (G), and blue (B) may be arranged in order along the second electrode 1040, whereby a unit pixel may be realized. However, the present invention is not limited thereto.

The red color conversion part 1100 includes a porous layer 1101, a wavelength conversion layer 1102, a reflective layer 1103, and protrusions 1105 and 1107. The porous layer 1101 may be disposed on the other surface of the red color conversion part 1100, that is, near a surface to which blue (B) light from the semiconductor light emitting device 1050 is incident.

In an embodiment, the wavelength conversion layer 1102 serves to the blue (B) light into a color of the unit pixel like the above-described phosphor layer. That is, the wavelength conversion layer 1102 of the red color conversion part 1100 converts blue (B) light into red (R) light.

The porous layer 1101 minimizes emission of blue light emitted from the semiconductor light emitting device 1050 to the side of the red color conversion part 1100 to enhance efficiency of conversion of blue light into red light in the wavelength conversion layer 1102.

In addition, the reflective layer 1103 prevents emission of blue light that has not been converted into red light in the wavelength conversion layer 1102. Therefore, it is possible to prevent light converted in the wavelength conversion layer and the blue light which has not been converted into red light from being mixed and emitted. Further, blue light reflected by the reflective layer 1103 may be returned to the wavelength conversion layer 1102 and converted into the red light, improving color conversion efficiency. This will be described later in detail in FIG. 14A.

The reflective layer 1103 of the red color conversion part 1100 may include a plurality of layers 1103a to 1103d to efficiently reflect blue light that has not been converted into red light in the wavelength conversion layer 1102. At least one of the plurality of layers may include III-V compounds to efficiently reflect blue light. In an embodiment, in the red color conversion part 1100 for converting blue light into red light, the plurality of layers may be in a form in which a layer including AlAs and a layer including GaAs are stacked. In detail, the first layer 1103a of the reflective layer 1103 stacked on one surface of the wavelength conversion layer 1102 may be formed as an AlAs layer not doped with an impurity, and the second layer 1103b may be formed as a GaAs layer not doped with an impurity. Furthermore, the third layer 1103c may be formed as an AlAs layer not doped with an impurity, like the first layer 1103a. In addition, the fourth layer 1103d may be formed as a GaAs layer not doped with an impurity, like the second layer 1103b. However, the present invention is not limited thereto and the reflective layer 1103 of the red color conversion part 1100 may include a plurality of layers that may allow red light to pass therethrough and reflect blue light back to the wavelength conversion layer 1102 and may have and various configurations and various thicknesses.

The green color conversion part 1200 includes a porous layer 1201, a wavelength conversion layer 1202, a reflective layer 1203, and protrusions 1205 and 1207. The porous layer 1201 may be disposed on the other surface of the green color conversion part 1200, that is, near a surface to which blue (B) light of the semiconductor light emitting device 1050 is incident.

In an embodiment, the wavelength conversion layer 1202 serves to convert blue (B) light into a color of the unit pixel like the above-described phosphor layer. That is, the wavelength conversion layer 1202 of the green color conversion part 1200 converts blue (B) light into green (G) light.

Meanwhile, the porous layer 1201 may be formed in a manner similar to that of the porous layer 1101 described above. The porous layer 1201 may minimize emission of blue light emitted from the semiconductor light emitting device 1050 to the side of the green color conversion part 1200, improving efficiency of converting blue light into green light G by the wavelength conversion layer 1202.

Also, the reflective layer 1203 prevents blue light that has not been converted into green light from being emitted from the wavelength conversion layer 1202. Therefore, it is possible to prevent light which has been converted in the wavelength conversion layer and blue light which has not converted into green light from being mixed and emitted. Further, blue light reflected by the reflective layer 2103 may be returned to the wavelength conversion layer 2102 and converted into green light, improving color conversion efficiency. This will be described later in detail in FIG. 14B.

The reflective layer 1203 of the green color conversion part 1200 may include a plurality of layers 1203a to 1203e to efficiently reflect light which has not been converted into green light in the wavelength conversion layer 1202. At least one of the plurality of layers may include III-V compounds to efficiently reflect blue light.

In an embodiment, in the green color conversion part 1200 for converting blue light into green light, the plurality of layers of the reflective layer 1203 may be in a form in which layers including GaN are stacked. In detail, the first layer 1203a of the reflective layer 1203 stacked on one surface of the wavelength conversion layer 1202 may be formed as a GaN layer doped with a second conductivity type impurity, and the second layer 1203b and the fourth layer 1203d may be formed as GaN layers having a concentration of the second conductivity type impurity lower than that of the first layer 1203a. Also, the third layer 1203c and the fifth layer 1203e may be formed as GaN layers doped with the same second conductivity type impurity as that of the first layer 1203a.

The first layer 1203a, the third layer 1203c, and the fifth layer 1203e may be formed of an electro-polishable porous terminal. However, the present invention is not limited thereto and the reflective layer 1203 of the green color conversion part 1200 may include a plurality of layers allowing green light to be transmitted therethrough and reflecting blue light to be reflected to the wavelength conversion layer 1202, and may have various thicknesses.

Figure 12A:
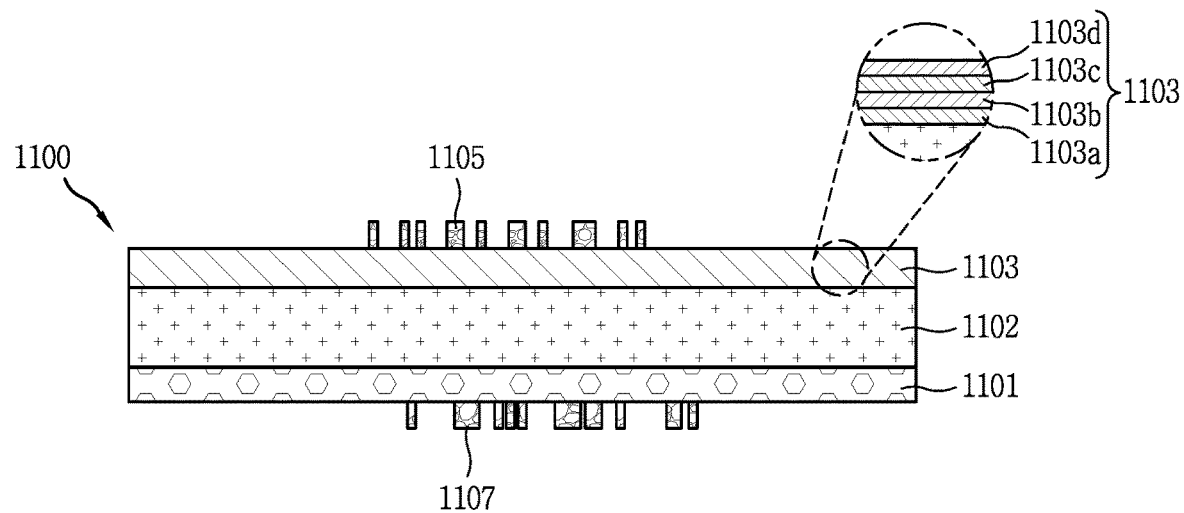
FIG. 12A is a conceptual view of the red color conversion part of FIG. 11.
Figure 12B:
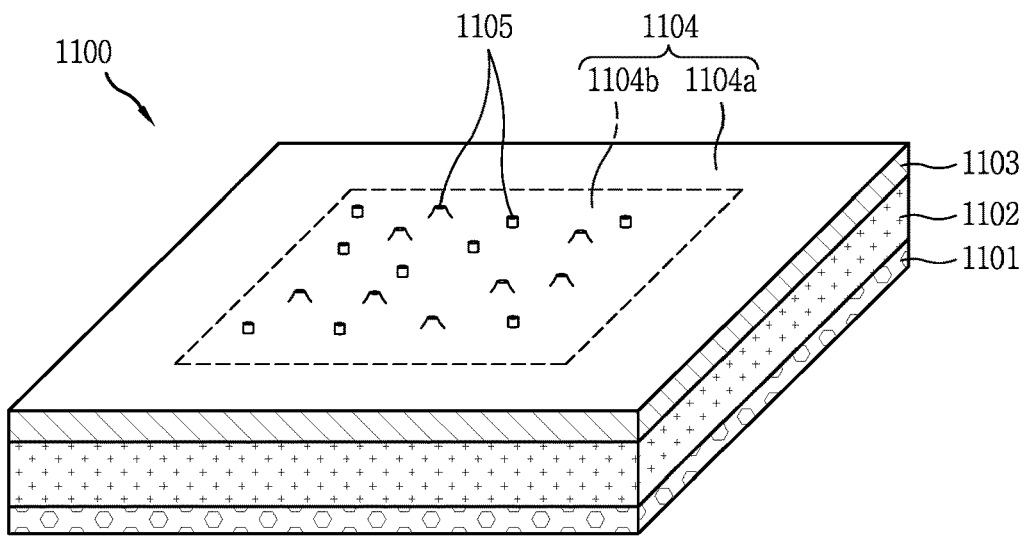
FIG. 12B is a perspective view of the red color conversion part of FIG. 11.
Figure 12C:
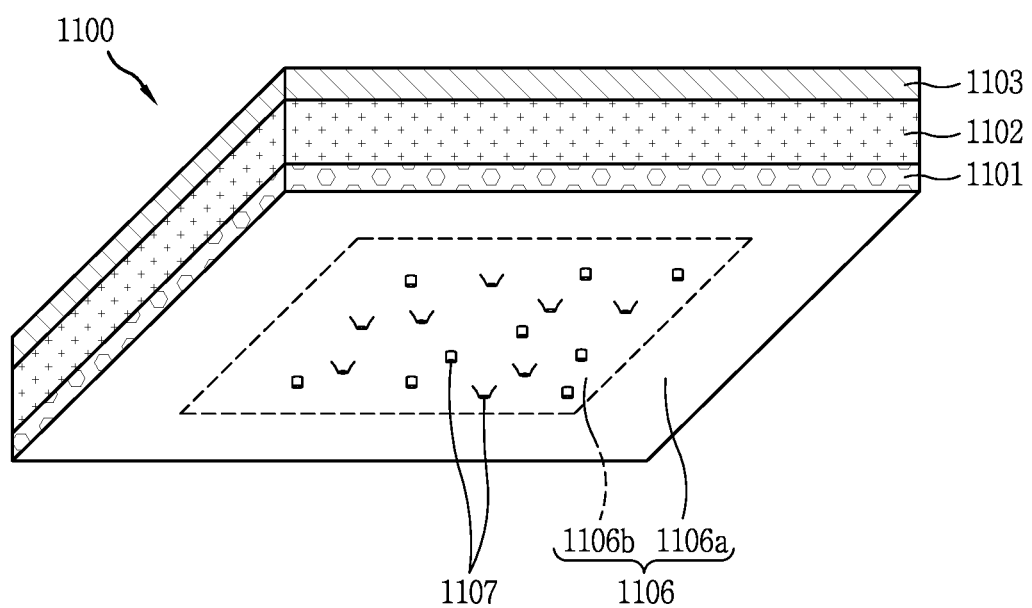
FIG. 12C is a bottom perspective view of the red color conversion part of FIG. 11.

FIG. 12A is a conceptual view of the red color conversion part 1100 of FIG. 11, and FIGS. 12B and 12C are perspective views of the red color conversion part 1100 of FIG. 11.

Referring to FIGS. 12A, 12B, and 12C, the red color conversion part 1100 may include the porous layer 1101, the wavelength conversion layer 1102, the reflective layer 1103, and a first protrusion 1105. The red color conversion part 1100 may further include a second protrusion 1107 on the other side of the porous layer 1101.

Referring to these figures, blue light emitted from the semiconductor light emitting device 1050 described above is transmitted sequentially to the second protrusion 1107, the porous layer 1101, the wavelength conversion layer 1102, the reflective layer 1103, and the first protrusion 1105. In particular, blue light emitted from the semiconductor light emitting device 1050 needs to be transmitted to the wavelength conversion layer 1102 without loss of light. Accordingly, the porous layer 1101 may be formed of a porous material which can be electro-polished. The porous layer 1101 may be formed of a second conductivity type semiconductor.

When passing through the porous layer 1101 formed of a porous material, blue light emitted from the semiconductor light emitting device 1050 may be transmitted to the wavelength conversion layer 1102 without being trapped in the porous layer 1101.

In addition, blue light emitted from the semiconductor light emitting device 1050 may be diffracted in the porous layer 1101. Therefore, loss of light emitted to the side of the red color conversion part 1100 may be minimized. Accordingly, loss of blue light emitted from the semiconductor light emitting device 1050 may be reduced, and color conversion efficiency in the case of converting blue light into red light through the red color conversion part 1100 may be increased.

In an embodiment, the wavelength conversion layer 1102 serves to convert the blue (B) light of the semiconductor light emitting device into the color of the unit pixel. In detail, the wavelength conversion layer 1102 of the red color conversion part 1100 may change blue (B) light into red (R) light.

The reflective layer 1103 may include a plurality of layers 1103a to 1103d to reflect blue light which has not been converted into red light in the wavelength conversion layer 1102. At least one of the plurality of layers may include III-V compounds to efficiently reflect blue light.

In an embodiment, in the red color conversion part 1100 converting blue light into red light, the plurality of layers may include a layer including AlAs and a layer including GaAs which are stacked sequentially.

In another embodiment, the wavelength conversion layer may convert blue (B) light of the semiconductor light emitting device into green (G) light, and in the case of converting blue light into green light, the plurality of layers of the reflective layer may be stacked layers including GaN.

Referring to FIG. 12B, a first region 1104a and a second region 1104b surrounded by the first region 1104a are formed on one surface of the reflective layer 1103, that is, on a surface 1104 of the reflective layer 1103. The first region 1104a and the second region 1104b of the surface 1104 have different roughnesses. In detail, the second region 1104b has a larger surface roughness than the first region 1104a, and a plurality of first protrusions 1105 are disposed in the second region 1104b.

In an embodiment, the first protrusions 1105 may be formed of a second conductivity type semiconductor and have higher porosity and higher impurity concentration than that of the porous layer 1101. The first protrusions 1105 may be formed of an electro-polishable material.

Furthermore, the first protrusions 1105 may be a porous structure having pores formed therein. Therefore, although the first protrusions 1105 are formed on the reflective layer 1103, the first protrusions 1105 do not disturb emitted light, minimizing loss of emitted light.

In addition, an upper surface of each of the first protrusions 1105 may be formed as a flat cut surface. In addition, some of the first protrusions 1105 may have a cylindrical shape. Also, the other of the first protrusions 1105 may have a conical shape. In addition, the first protrusions 1105 may have different heights.

Meanwhile, referring to FIG. 12C, a surface 1106 of the other surface of the porous layer 1101 includes a first region 1106a and a second region 1106b surrounded by the first region 1106a. The second region 1106b may have a surface roughness higher than that of the first region 1106a and a plurality of second protrusions 1107 may be disposed in the second region 1106b.

In an embodiment, the second protrusion 1107 may be formed of a second conductivity type semiconductor and have an impurity concentration higher than that of the porous layer 1101. The second protrusions 1107 may be formed of an electro-polishable material, like the porous layer 1101.

The second protrusions 1107 may be a porous structure having pores therein. In detail, porosity of the second protrusions 1107 may be higher than the porosity of the porous layer 1101. Therefore, although the second protrusions 1107 is formed on the other surface of the porous layer 1101, loss of light when blue light emitted from the semiconductor light emitting device 1050 is transmitted to the wavelength conversion layer 1102 may be minimized.

In addition, an upper surface of each of the second protrusions 1107 may be formed as a flat cut surface. In addition, some of the second protrusions 1107 may have a cylindrical shape. Also, the other of the second protrusions 1107 may have a conical shape. In addition, the second protrusions 1107 may have different heights.

Figure 13A:
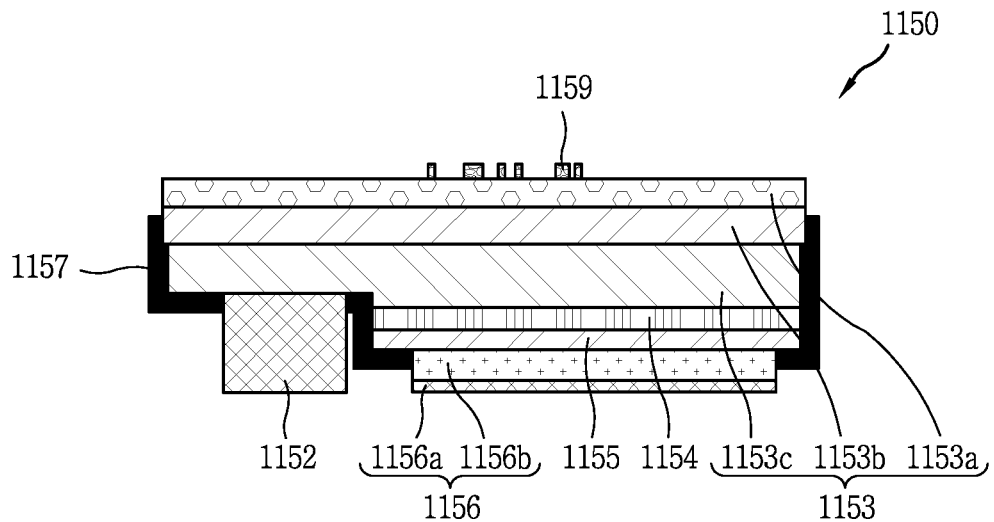
FIG. 13A is a conceptual view illustrating a flip chip type semiconductor light emitting device of FIG. 11.
Figure 13B:
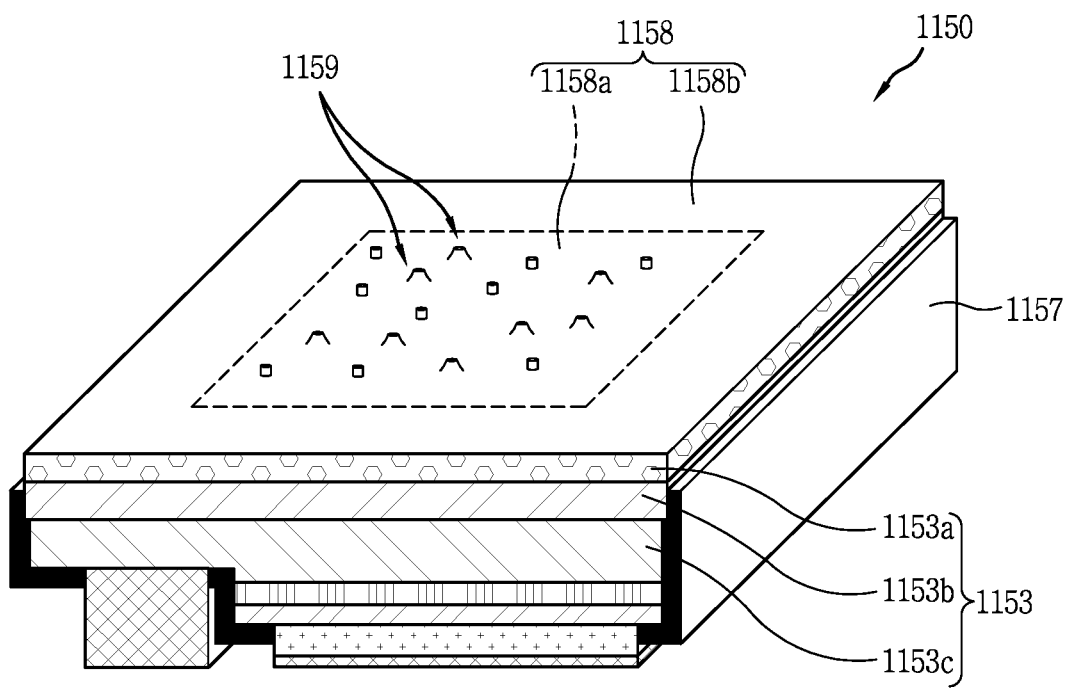
FIG. 13B is a perspective view illustrating the flip chip type semiconductor light emitting device of FIG. 11.

FIG. 13A is a conceptual view illustrating the flip chip type semiconductor light emitting device 1050 of FIG. 11, and FIG. 13B is a perspective view illustrating the flip chip type semiconductor light emitting device 1050 of FIG. 11.

Referring to the semiconductor light emitting device 1050, since the layer formed of the porous material is disposed in the semiconductor light emitting device 1050 to minimize light emitted to the side surface of the semiconductor light emitting device 1050 and light is emitted to the surface of the semiconductor light emitting device 1050, luminous efficiency of the semiconductor light emitting device 1050 may be increased.

Referring to FIGS. 13A and 13B, the semiconductor light emitting device 1050 of a display device 1000 includes a first conductivity type electrode 1156, a second conductivity type electrode 1152, a first conductivity type semiconductor layer 1155 on which the first conductivity type electrode 1156 is disposed, a second conductivity type semiconductor layer 1153 overlapping the first conductivity type semiconductor layer 1155 and allowing the second conductivity type electrode 1152 to be disposed thereon, and an active layer 1154 disposed between the first conductivity type semiconductor layer 1155 and the second conductivity type semiconductor layer 1153.

The first conductivity type electrode 1156 is formed on one surface of the first conductivity type semiconductor layer 1155 and the active layer 1154 is formed between the other surface of the first conductivity type semiconductor layer 1155 and one surface of the second conductivity type semiconductor layer 1153, and the second conductivity type electrode 1152 is formed on one surface of the second conductivity type semiconductor layer 1153. In this case, the second conductivity type electrode 1152 may be disposed on one surface of the second conductivity type semiconductor layer 1153 covered by the first conductivity type semiconductor layer 1155.

The first conductivity type electrode 1156 and the first conductivity type semiconductor layer 1155 may be a p-type electrode and a p-type semiconductor layer, respectively, and the second conductivity type electrode 1152 and the second conductivity type semiconductor layer 1153 may be an n-type electrode and an n-type semiconductor layer, respectively. However, the present invention is not limited thereto and the first conductivity type may be n-type and the second conductivity type may be p-type.

The first conductivity type electrode 1156 and the second conductivity type electrode 1152 may be formed of a multilayer that functions as an adhesive layer, a barrier layer, a low-resistive layer, and an anti-oxidation layer.

More specifically, the first conductivity type electrode 1156 may include a conductive electrode 1156a and a reflective electrode 1156b.

In an embodiment, the reflective electrode 1156b may be designed to reflect light emitted from the semiconductor light emitting device 1050. The reflective electrode 1156b may be formed to emit light, which may be lost to the other surface of the semiconductor light emitting device 1050, that is, in a direction toward the substrate, of light emitted from the semiconductor light emitting device 1050, to an emission surface of the semiconductor light emitting device 1050. Therefore, the color conversion parts 1100 and 1200 may be utilized without loss of the light emitted from the semiconductor light emitting device, maximizing color conversion efficiency.

The semiconductor light emitting device 1050 includes a passivation layer 1157 formed to cover outer surfaces of the first conductivity type semiconductor layer 1155 and the second conductivity type semiconductor layer 1153. For example, the passivation layer 1157 may be formed to cover side surfaces and the lower surfaces of the first conductivity type semiconductor layer 1155 and the second conductivity type semiconductor layer 1153.

In detail, the passivation layer 1157 is formed to cover the side surface of the semiconductor light emitting device to stabilize characteristics of the semiconductor light emitting device 1050 and is formed of an insulating material. For example, the passivation layer 1157 may be an insulating thin film formed of a silicon compound or oxide. As described above, since the first conductivity type semiconductor layer 1155 and the second conductivity type semiconductor layer 1153 are electrically disconnected by the passivation layer 1157, P-type GaN and the N-type GaN of the semiconductor light emitting device may be insulated from each other.

In this case, the passivation layer 1157 may include a plurality of passivation layers having different refractive indices to reflect light emitted to the side surfaces of the first conductivity type semiconductor layer 1155 and the second conductivity type semiconductor layer 1153.

However, the present invention is not limited thereto, and the passivation layer 1157 may be formed as a single layer. The plurality of passivation layers may be formed by repeatedly stacking a material having a relatively high refractive index and a material having a relatively low refractive index.

The second conductive semiconductor layer 1153 is formed of an electro-polishable porous terminal and includes a first layer 1153a disposed on the outer side of the semiconductor light emitting device 1050, a second layer 1153b disposed under the second layer 1153b and having an impurity concentration lower than that of the first layer 1153a, and a third layer 1153c disposed between the second layer 1153b and the active layer 1154 and having an impurity concentration higher than that of the second layer 1153b.

In detail, impurity concentrations may be higher in order of the first layer 1153a, the third layer 1153c, and the second layer 1153b. That is, the impurity concentration of the first layer 1153a may be higher than that of the third layer 1153c, and the second layer 1153b of the second conductivity type semiconductor layer 1153 may have a lowest impurity concentration.

The first layer 1153a may be formed of an electro-polishable porous terminal. In detail, the first layer 1153a of the porous material allows light generated in the semiconductor light emitting device 1050 to emit light to an emission surface of the semiconductor light emitting device, without being trapped in the first layer 1153a.

In addition, light generated inside the semiconductor light emitting device 1050 may be diffracted in the first layer 1153a. Therefore, loss of light emitted to the side of the semiconductor light emitting device 1050 may be minimized. Accordingly, since a large amount of light is emitted to the emission surface of the semiconductor light emitting device 1050, luminous efficiency of the semiconductor light emitting device 1050 may be increased.

In addition, a surface 1158 of the first layer 1153a includes a first region 1158a and a second region 1158b surrounded by the first region 1158a. The surface 1158 of the first layer 1153a includes the first region 1158a and the second region 1158b having different roughnesses. Specifically, the second region 1158b has a surface roughness higher than that of the first region 1158a, and a plurality of third protrusions 1159 are disposed in the second region 1158b.

In an embodiment, the third protrusions 1159 may be formed of a second conductivity type semiconductor and have an impurity concentration higher than that of the first layer 1153a. The third protrusions 1159 may also be formed of an electro-polishable material, like the first layer 1153a.

Further, the third protrusions 1159 may be a porous structure having pores therein. In detail, porosity of the third protrusions 1159 may be higher than porosity of the first layer 1153a. Therefore, although the third protrusions 1159 are formed on the first layer 1153a, light emitted from the semiconductor light emitting device 1050 is not disturbed, loss of emitted light may be minimized, and a large amount of light may be emitted to the emission surface of the semiconductor light emitting device 1050.

In addition, an upper surface of each of the third protrusions 1159 may be formed as a flat cut surface. In addition, some of the third protrusions 1159 may have a cylindrical shape. Also, the other of the third protrusions 1159 may have a conical shape. In addition, the third protrusions 1159 may have different heights.

Figure 14A:
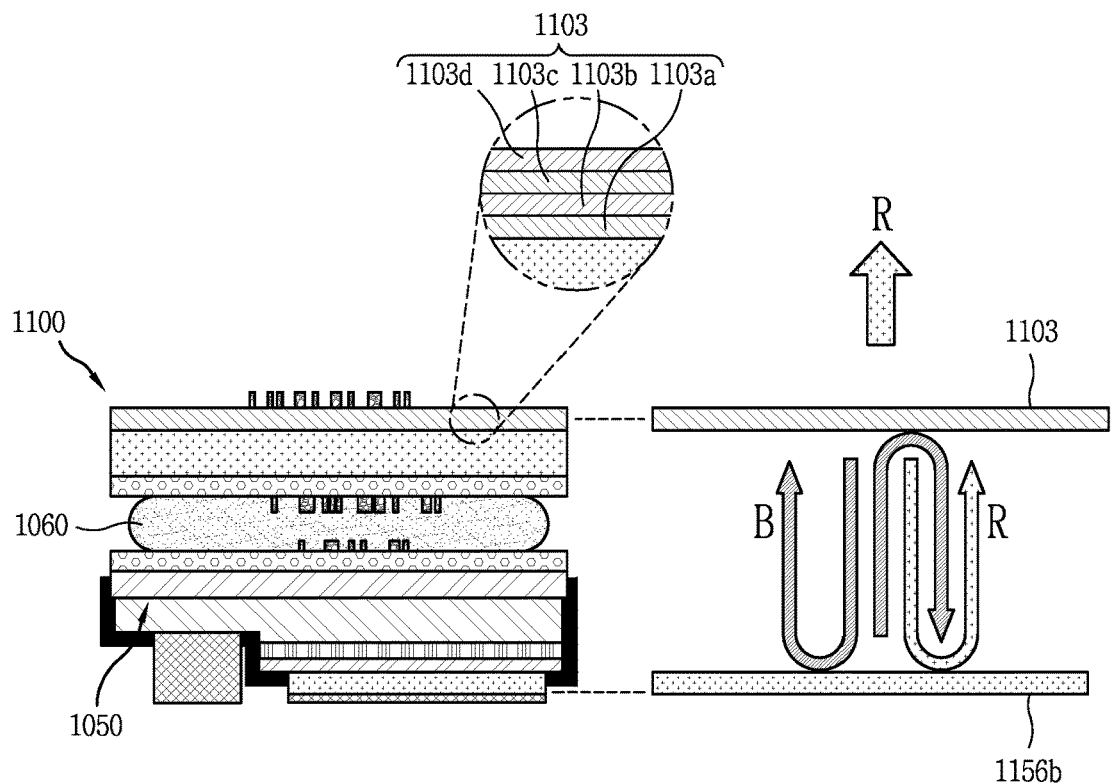
FIG. 14A is a schematic view illustrating color conversion in the red color conversion part of FIG. 11.
Figure 14B:
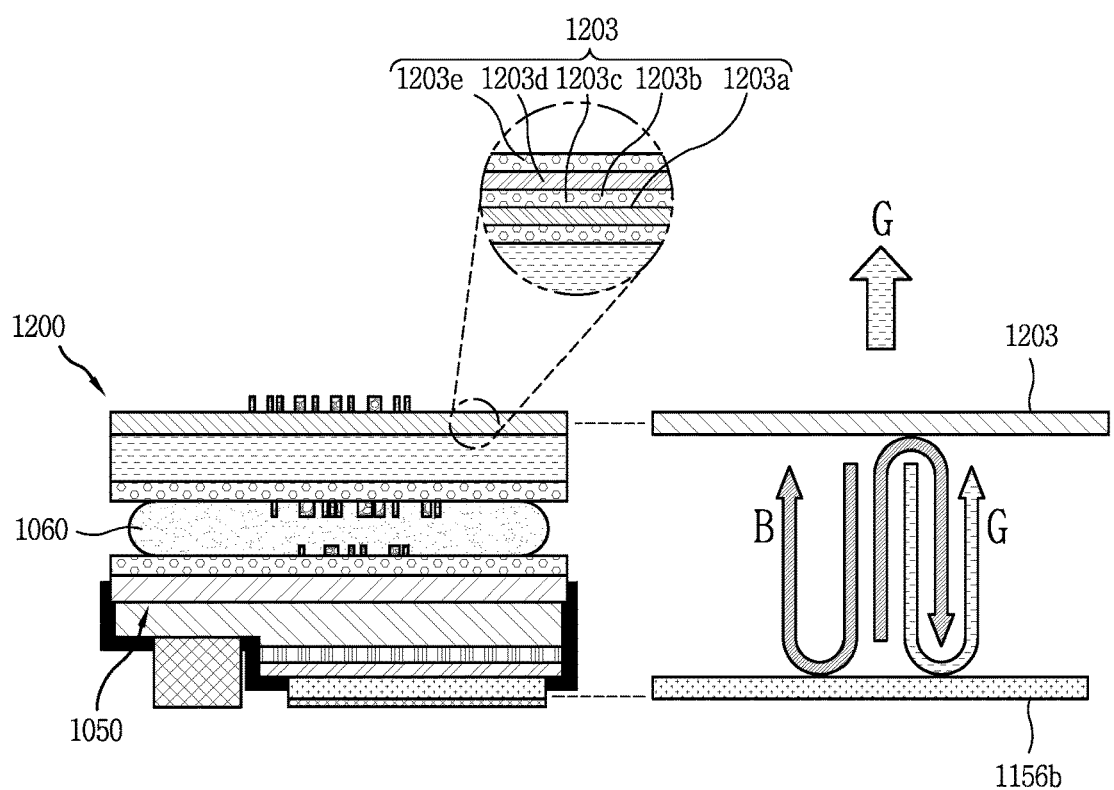
FIG. 14B is a schematic view illustrating color conversion in a green color conversion part in FIG. 11.

FIG. 14A is a schematic view illustrating color conversion in the red color conversion part 1100 of FIG. 11, and FIG. 14B is a schematic view illustrating color conversion in the green color conversion part 1200 in FIG. 11.

Referring to FIG. 14A, the semiconductor light emitting device 1050 may be a blue semiconductor light emitting device that emits blue (B) light, and blue (B) light incident through the adhesive member 1060 passes through the wavelength conversion layer 1102 so as to be converted into red (R) light. Further, the reflective layer 1103 including a plurality of layers may allow red (R) light to be transmitted therethrough and reflect blue (B) light which has not been converted into red light in the wavelength conversion layer 1102, to the wavelength conversion layer 1102. Accordingly, blue (B) light reflected from the reflective layer 1103 may be converted into red light in the wavelength conversion layer 1102 again.

Meanwhile, among light emitted from the semiconductor light emitting device 1050, light that may be lost to the other surface of the semiconductor light emitting device 1050, that is, in the direction toward the substrate, may be reflected from the reflective electrode 1156b. Accordingly, light may be emitted to the emission surface of the semiconductor light emitting device 1050 without loss, and light reflected from the reflective electrode 1156b may be converted into red light in the wavelength conversion layer 1102, maximizing color conversion efficiency.

Although a thickness of the entire red color conversion part 1100 is reduced by interaction between the reflective layer 1103 of the red color conversion part 1100 and the reflective electrode 1156b of the semiconductor light emitting device 1050, color conversion efficiency may be maximized.

Referring to FIG. 14B, the semiconductor light emitting device 1050 is a blue semiconductor light emitting device that emits blue light. The blue light incident through the adhesive member 1060 passes through the wavelength conversion layer 1202 so as to be converted into green (G) light. The reflective layer 1103 including a plurality of layers allows green (G) light to pass therethrough and reflects blue (B) light, which has not been converted into green light in the wavelength conversion layer 1202, to the wavelength conversion layer 1202. Accordingly, the blue (B) light reflected from the reflective layer 1103 may be converted into green light in the wavelength conversion layer 1202 again.

Meanwhile, among light emitted from the semiconductor light emitting device 1050, light that may be lost to the other surface of the semiconductor light emitting device 1050, that is, in the direction of the substrate, may be reflected from the reflective electrode 1156b. Accordingly, light may be emitted to the emission surface of the semiconductor light emitting device 1050, without loss, and light reflected from the reflective electrode 1156b may be converted into green light in the wavelength conversion layer 1202, maximizing color conversion efficiency.

As described above, although a thickness of the entire green color conversion part 1200 is reduced by the interaction of the reflective layer 1103 of the green color conversion part 1200 and the reflective electrode 1156b of the semiconductor light emitting device 1050, color conversion efficiency may be maximized.

Since the display device 1000 according to the present invention includes the reflective layers 1103 and 1203 and the reflective electrode 1156b, the thin color conversion parts 1100 and 1200 may advantageously be provided in the display device in which pixel integration or pixel density is higher, the semiconductor light emitting device is small, and a space between pixels is narrow.

Meanwhile, the semiconductor light emitting device applied to the display device described above may be modified into various forms. These modifications will be described later.

Figure 15:
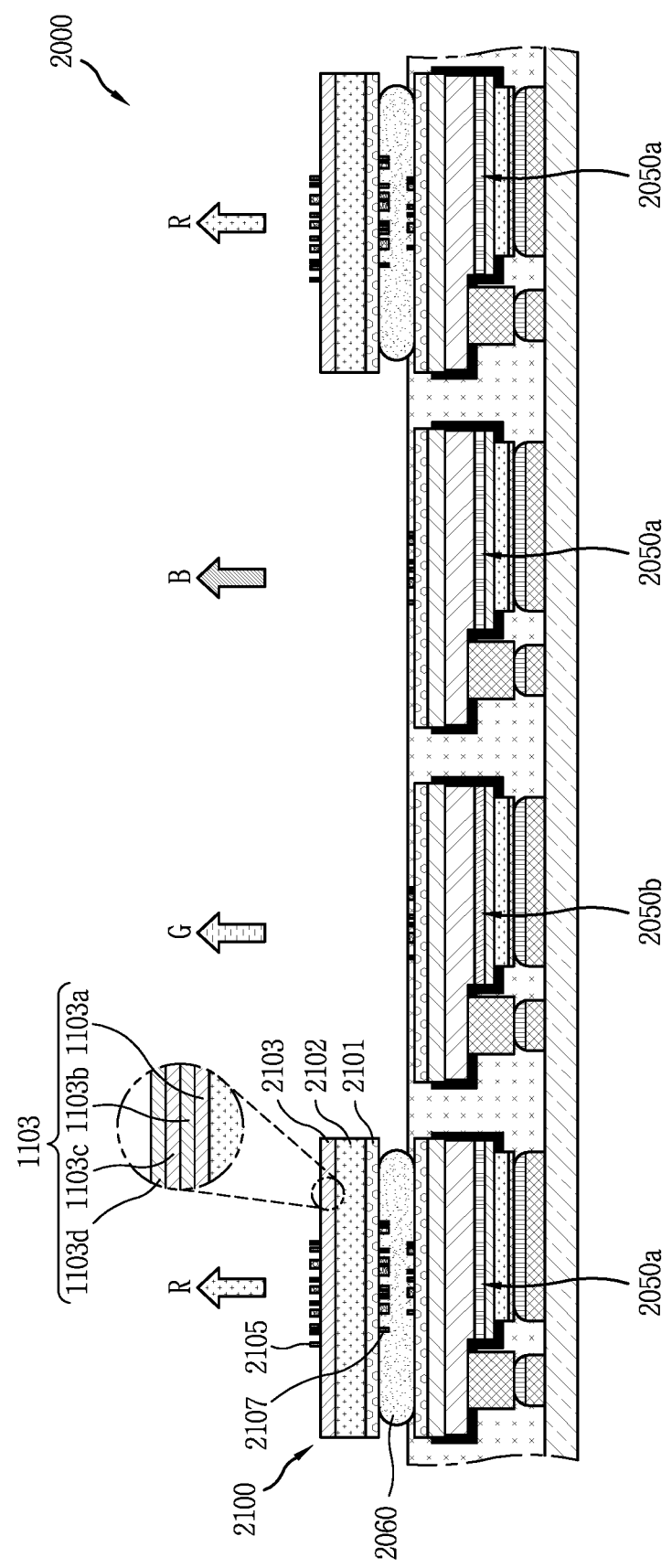
FIG. 15 is a cross-sectional view for explaining another embodiment of a display device to which a new structure is applied.
Figure 16:
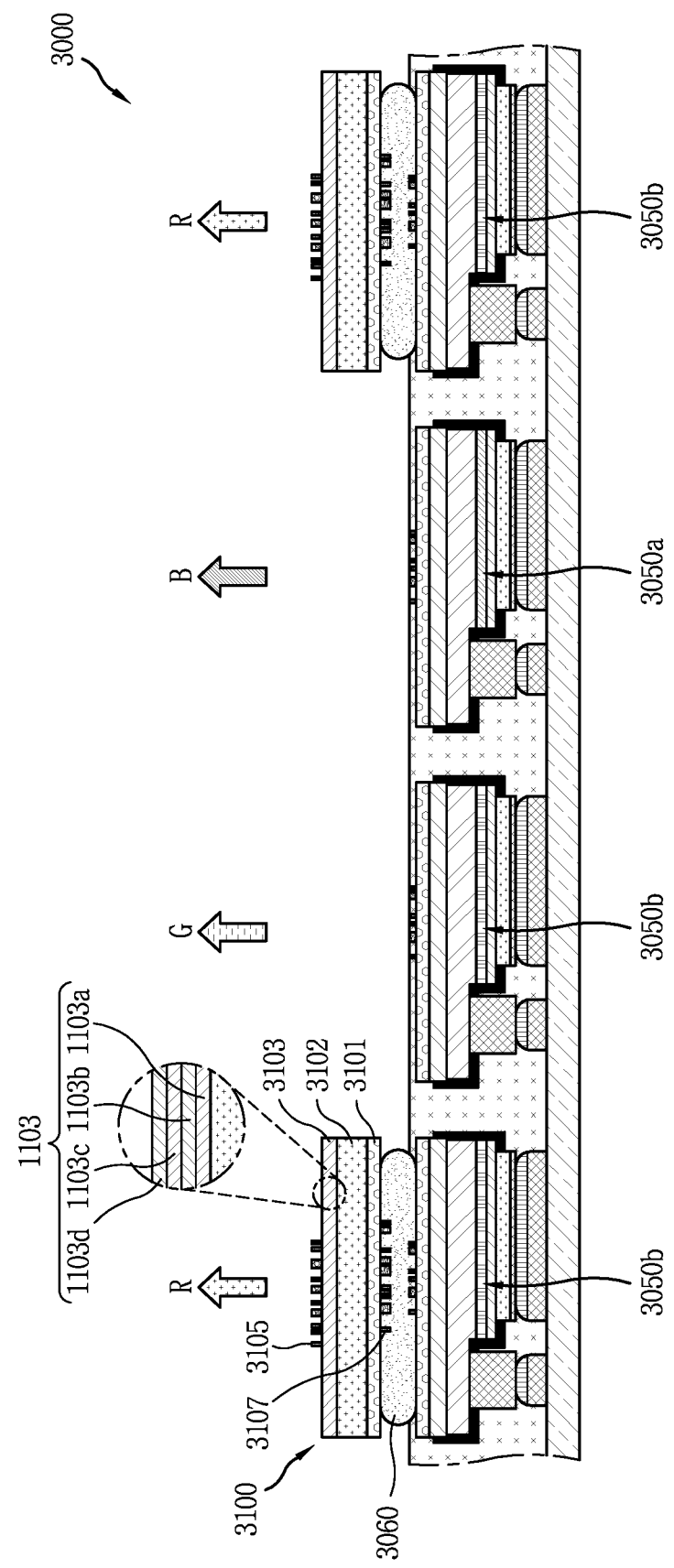
FIG. 16 is a cross-sectional view for explaining another embodiment of a display device to which a new structure is applied.
Figure 17:
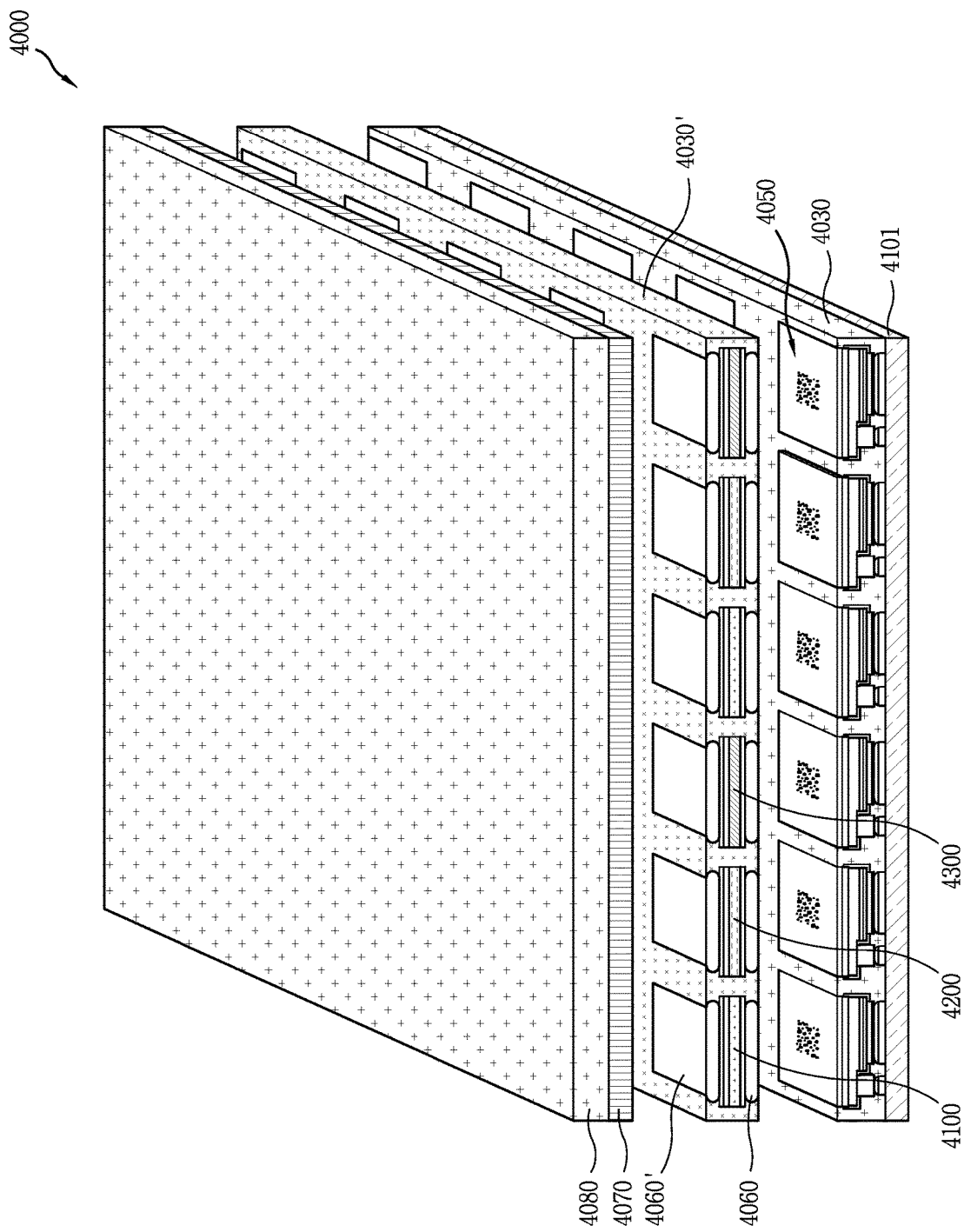
FIG. 17 is an enlarged view of portion "A" in FIG. 1 for explaining another embodiment of a display device to which a new structure is applied.

FIG. 15 is a cross-sectional view for explaining another embodiment of a display device 2000 to which the new structure is applied, and FIG. 16 is a cross-sectional view for explaining another embodiment of the present invention of a display device 3000 to which the new structure is applied. FIG. 17 is an enlarged view of the portion "A" of FIG. 1 for explaining another embodiment of the present invention to which a display device 4000 of a new structure is applied.

Referring to FIG. 15, the display device 2000 may include a blue semiconductor light emitting device 2050a and a green semiconductor light emitting device 2050b. In detail, a red color conversion part 2100 may be stacked on the blue semiconductor light emitting device 2050a at a position corresponding to a red unit pixel.

Referring to FIG. 16, the display device 3000 may include a blue semiconductor light emitting device 3050a and a green semiconductor light emitting device 3050b. In detail, a red color conversion part 3100 may be stacked on the green semiconductor light emitting device 3050b at a position forming a red unit pixel. Accordingly, green (G) light emitted from the green semiconductor light emitting device 3050b may be converted into red (R) light.

Referring to FIGS. 15 and 16, only the green semiconductor light emitting device 2050b may be used for a portion forming the green unit pixel, and the blue semiconductor light emitting device 2050a may be used to form a unit pixel. Accordingly, the unit pixels of red (R), green (G), and blue (B) may form one pixel in the display devices 2000 and 3000.

Referring to FIG. 17, the display device 4000 may include a white semiconductor light emitting device 4050. In this case, in order to form a unit pixel, a red color conversion part 4100, a green color conversion part 4200, and a blue color conversion part 4300 may be provided on the white semiconductor light emitting device 4050 so that red (R), green (G), and blue (B) unit pixels may form one pixel.

The display device 4000 may further include an insulating member 4030' surrounding a red color conversion part 4100, a green color conversion part 4200, and a blue color conversion part 4300. In addition, the display device 400 may further include an adhesive member 4060' on the red color conversion part 4100, the green color conversion part 4200, and the blue color conversion part 4300. Further, a polyimide 4070 and a glass 4080 may be further provided on the adhesive member 4060' to protect the white color semiconductor light emitting device 4050, the red color conversion part 4100, the green color conversion part 4200, and the blue color conversion unit 4300.

Figure 18:
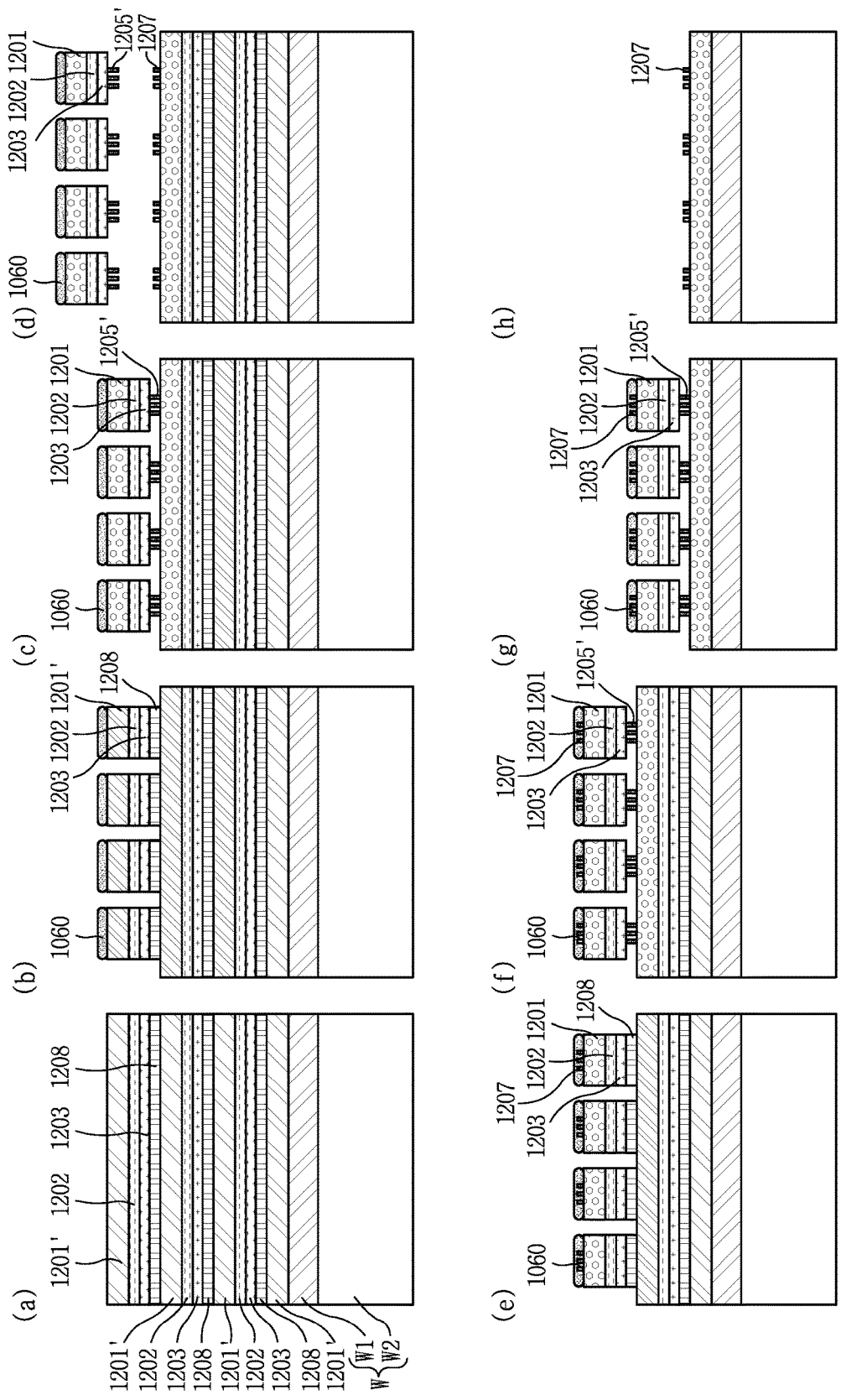
FIG. 18 is a cross-sectional view illustrating a method of manufacturing a color conversion part of the present invention.

FIG. 18 is a cross-sectional view illustrating a method of manufacturing the green color conversion part 1200 of the present invention. In the method of manufacturing the green color conversion part 1200 described below, the same or similar reference numerals are given to the same or similar components as those of the previous embodiment, and the description thereof is replaced with the first description.

Referring to (a) of FIG. 18, a plurality of layers for manufacturing the green color conversion part 1200 may be stacked on a growth substrate W. In detail, the growth substrate W may include an undoped semiconductor layer W1 and a growth substrate W2 formed of a sapphire substrate or a silicon substrate.

In order to manufacture the green color conversion part 1200, a second conductivity type semiconductor layer 1201', a wavelength conversion layer 1202, a reflective layer 1203, and a sacrificial layer 1208 which can be electro-polished may be formed on the growth substrate W. Further, the second conductivity type semiconductor layer 1201', the wavelength conversion layer 1202, the reflective layer 1203, and the sacrificial layer 1208 for manufacturing the green color conversion part 1200 do not need to be electrically connected to each other. Thus, the second conductivity type semiconductor layer 1201', the wavelength conversion layer 1202, the reflective layer 1203, and the sacrificial layer 1208 may be paired and stacked as several layers. The green color conversion part 1200 may be continuously manufactured repeatedly by etching the pair of the second conductivity type semiconductor layers 1201', the pair of the wavelength conversion layers 1202, the pairs of reflective layers 1203, and the pair of sacrifice layers 1208.

Referring to (b) of FIG. 18, a pattern of the adhesive member 1060 may be formed on the second conductivity type semiconductor layer 1201' and then etched to isolate the second conductivity type semiconductor layer 1201', the wavelength conversion layer 1202, the reflective layer 1203, and the sacrificial layer 1208 in the form of the green color conversion part 1200.

Referring to (c) of FIG. 18, electrolytic polishing may be performed by applying flow of a current to the second conductivity type semiconductor layer 1201' and the sacrificial layer 1208 on an electrolyte. Accordingly, a part of the second conductivity type semiconductor layer 1201' may be etched to form the porous layer 1201. Further, in the sacrificial layer 1208 having a higher concentration of the second conductivity type impurity, electrolytic polishing may be more actively performed due to a difference in reaction rate. Accordingly, a plurality of columns 1205', which are porous structures having pores formed therein, may be formed. That is, porosity of the column 1205' may be higher than porosity of the porous layer 1201 due to the difference in reaction rate according to electrolytic polishing.

Referring to (d) of FIG. 18, the green color conversion part 1200 may be adhered to the emission surface of the semiconductor light emitting device 1050 through the adhesive member 1060 and transferred. The green color conversion part 1200 may be separated by an external force and a plurality of columns 1205', which are porous structures having pores formed therein, may be cut. As described above, the green color conversion part manufactured in steps (a) to (d) of FIG. 18 may not include the second protrusions. The columns 1205' may be cut and separated into the first protrusions 1205 on the reflective layer 1203 and the second protrusions 1207 on the porous layer 1201 of the green color conversion part to be manufactured subsequently.

Thereafter, as shown in (e) to (h) of FIG. 18, the green color conversion part 1200 may be transferred to the above-described semiconductor light emitting device 1050 by repeating the above-described processes of (a) to (d) of FIG. 18. Further, when the green color conversion part 1200 is transferred to the semiconductor light emitting device 1050, the columns 1205' are cut by an external force to form the second protrusions 1207 on the porous layer 1201 of the green color conversion part 1200. Accordingly, the green color conversion part manufactured in (e) to (h) of FIG. 18 may further include the second protrusions 1207 on the porous layer 1201.

Furthermore, the above-described red color conversion part 1100 may also be manufactured by the manufacturing method described in FIG. 18.

The color conversion part described above may include the porous layer formed of an electro-polishable porous terminal to so as to be provided as a thin color conversion part. Accordingly, the display device, which has a high pixel concentration or a high pixel density, has a small semiconductor light emitting device, has pixels in a narrow interval therebetween, capable of realizing color may be provided.

In addition, since the color conversion part includes the reflective layer, emission of light which has not been converted in the wavelength conversion layer of the color conversion part, after being emitted from the semiconductor light emitting device, may be prevented to prevent color mixture with light converted in the wavelength conversion layer, maximizing color conversion efficiency.

In addition, in the above-described semiconductor light emitting device, since the reflective electrode is provided between the first conductivity type electrode and the first conductivity type semiconductor layer, light emitted from the semiconductor light emitting device may be utilized in the color conversion part without loss of light, and thus, color conversion efficiency may be maximized.

The above-described display device using the semiconductor light emitting device is not limited to the configuration and method of the embodiments described above, but all or a part of the embodiments may be selectively combined to various modifications.

The foregoing embodiments and advantages are merely exemplary and are not to be considered as limiting the present disclosure. The present teachings may be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A display device comprising:
   a substrate including an electrode;
   a plurality of semiconductor light emitting devices assembled on the substrate; and
   a color conversion part stacked on the plurality of semiconductor light emitting devices and converting a color,
   wherein the color conversion part includes:
      a porous layer;
      a wavelength conversion layer; and
      a reflective layer,
   wherein
      the wavelength conversion layer is disposed between the porous layer and the reflective layer,
      the porous layer is formed of an electro-polishable porous terminal,
      a surface of the reflective layer includes a first region and a second region surrounded by the first region,
      the second region has roughness higher than that of the first region, and
      a plurality of first protrusions are disposed in the second region, and
   wherein an adhesive member is provided between the porous layer of the color conversion part and one surface of the semiconductor light emitting device so that the color conversion part and the semiconductor light emitting device and be physically coupled.

2. The display device of claim 1, wherein an upper surface of each of the plurality of first protrusions is a flat cut surface.

3. The display device of claim 1, wherein a surface of the porous layer includes:
   a first region; and
   a second region surrounded by the first region, the second region has roughness higher than that of the first region, and a plurality of second protrusions are disposed in the second region.

4. The display device of claim 3, wherein an upper surface of each of the plurality of second protrusions is a flat cut surface.

5. The display device of claim 1, wherein the reflective layer includes a plurality of layers, and at least one of the plurality of layers of the reflective layer is a layer including III-V compounds.

6. The display device of claim 1, wherein the adhesive member is formed of a transparent material allowing light emitted from the semiconductor light emitting device to pass therethrough.

7. The display device of claim 1, wherein the semiconductor light emitting device includes:
   first and second conductivity type electrodes;
   a first conductivity type semiconductor layer allowing the first conductivity type electrode to be disposed thereon;
   a second conductivity type semiconductor layer overlapping the first conductivity type semiconductor layer and allowing the second conductivity type electrode to be disposed thereon; and
   an active layer disposed between the first and second conductivity type semiconductor layers,
   wherein the second conductivity type semiconductor layer includes:
      a first layer formed of an electro-polishable porous terminal, and disposed on an outer side of the semiconductor light emitting device;
      a second layer disposed under the first layer and having an impurity concentration lower than that of the first layer; and a third layer disposed between the second layer and the active layer and having an impurity concentration higher than that of the second layer.

8. The display device of claim 7, further comprising:
a reflective electrode disposed between the first conductivity type electrode and the first conductivity type semiconductor layer.

9. The display device of claim 7, herein a surface of the first layer includes:
a first region; and
a second region surrounded by the first region;
the second region has surface roughness higher than that of the first region, and
a plurality of third protrusions are disposed in the second region.

10. The display device of claim 9, wherein the plurality of third protrusions are formed of a second conductivity type semiconductor and have an impurity concentration higher than that of the first layer.

11. The display device of claim 3, wherein the plurality of second protrusions have an impurity concentration higher than that of the porous layer.

\* \* \* \* \*